US009389854B2

(12) United States Patent
De Laurentiis

(10) Patent No.: US 9,389,854 B2
(45) Date of Patent: Jul. 12, 2016

(54) ADD-COMPARE-SELECT INSTRUCTION

(71) Applicant: QUALCOMM Incorporated, San Diego, CA (US)

(72) Inventor: Nico De Laurentiis, Farnborough (GB)

(73) Assignee: Qualcomm Incorporated, San Diego, CA (US)

( * ) Notice: Subject to any disclaimer, the term of this patent is extended or adjusted under 35 U.S.C. 154(b) by 659 days.

(21) Appl. No.: 13/841,878

(22) Filed: Mar. 15, 2013

(65) Prior Publication Data

US 2014/0281420 A1    Sep. 18, 2014

(51) Int. Cl.
*G06F 9/30*  (2006.01)
*H03M 13/41*  (2006.01)
*G06F 9/38*  (2006.01)

(52) U.S. Cl.
CPC .......... *G06F 9/3001* (2013.01); *G06F 9/30021* (2013.01); *G06F 9/30036* (2013.01); *H03M 13/4107* (2013.01)

(58) Field of Classification Search
None
See application file for complete search history.

(56) References Cited

U.S. PATENT DOCUMENTS

| 5,946,361 A | 8/1999 | Araki et al. |
| 8,201,064 B2 | 6/2012 | Ferguson |
| 2003/0028844 A1 | 2/2003 | Coombs |
| 2009/0182990 A1* | 7/2009 | Muff ........................ G06F 7/22 712/221 |
| 2010/0235421 A1 | 9/2010 | Liu |
| 2012/0198316 A1 | 8/2012 | Graef |
| 2012/0324318 A1 | 12/2012 | Chowdhury et al. |
| 2013/0031337 A1 | 1/2013 | Larin et al. |

OTHER PUBLICATIONS

Internatinoal Search Report and Written Opinion for International Application No. PCT/US2014/024203, ISA/EPO, Date of Mailing, Jun. 6, 2014.

* cited by examiner

*Primary Examiner* — Scott Sun
(74) *Attorney, Agent, or Firm* — Toler Law Group, PC

(57) ABSTRACT

An apparatus includes memory storing an instruction that identifies a first register, a second register, and a third register. Upon execution of the instruction by a processor, a vector addition operation is performed by the processor to add first values from the first register to second values from the second register. A vector subtraction operation is also performed upon execution of the instruction to subtract the second value from third values from the third register. A vector compare operation is also performed upon execution of the instruction to compare results of the vector addition operation to results of the vector subtraction operation.

26 Claims, 5 Drawing Sheets

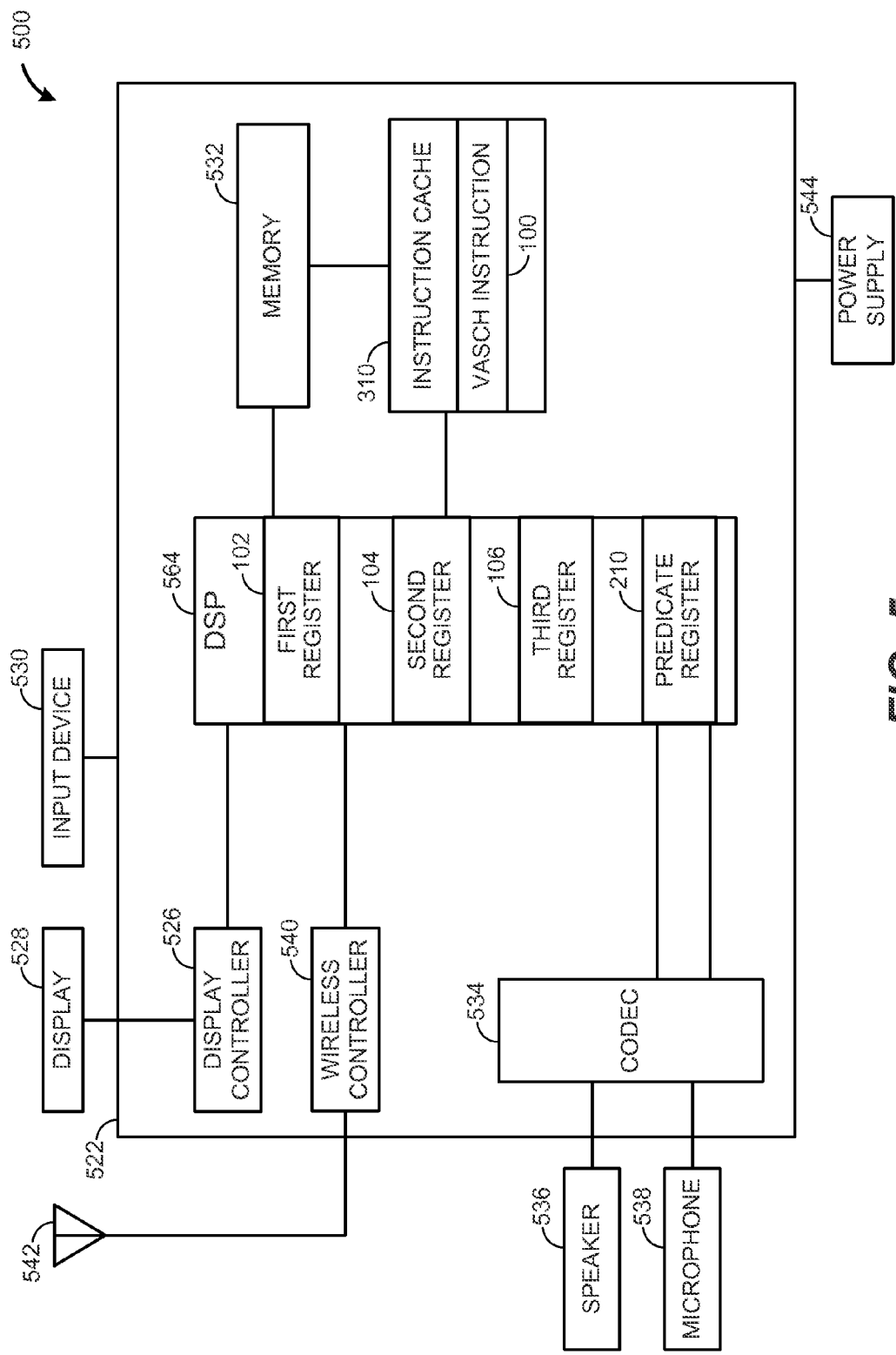

ADD-COMPARE-SELECT INSTRUCTION

I. FIELD

The present disclosure is generally related to an add-compare-select instruction.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones that perform multimedia processing such as audio or video decoding may often use algorithms, such as a Viterbi algorithm, to decode encoded signals. For example, a binary signal may be encoded at multiple encoding stages (e.g., convolutional encoding) to generate an encoded binary signal. At each encoding stage, an encoding operation may change a state (S) of the binary signal. The state of the binary signal may correspond to a state of an encoder within the wireless telephone at a particular time (k) (e.g., at a particular encoding stage). For example, a first encoding operation may be performed on the binary signal to generate a first state during a first encoding stage, and a second encoding operation may be performed on the first state to generate a second state during a second encoding stage, etc. The encoded binary signal is generated after the encoding operations are completed. The order of the successive states may generate a distinct path (i.e., a Viterbi path) that corresponds to the encoded binary signal.

The wireless telephone may recover the path to decode the encoded binary signal by tracing the successive states to the binary signal. For example, from the encoded binary signal (e.g., the state associated with the encoded binary signal) the wireless telephone may trace back preceding states (e.g. previous states) generated during encoding to the binary signal to reconstruct the path. A preceding state of the path may be determined at each arrival state (i.e. "current" state), and the process may be repeated until the binary signal is recovered (e.g., the path is traced back to the binary signal). This process may be referred to as convolutional decoding. The Viterbi algorithm may be used to decode the encoded binary signal. For example, the wireless telephone, at a decoder, may use the Viterbi algorithm to determine the preceding state of the path from the arrival state of the path and repeat the process until the binary signal is recovered. The preceding state may be determined based on path metrics used to recover the arrival state. However, determining the preceding state at a decoding stage may utilize multiple instructions. Using multiple instructions to determine a preceding state during a decoding stage may increase processing time.

III. SUMMARY

A single instruction that determines a preceding state during a decoding stage using the Viterbi algorithm is disclosed. For example, a most likely sequence of states (i.e., the Viterbi path) may be found using the Viterbi algorithm. The Viterbi path may be in a trellis of states where there are multiple states with multiple paths that lead to each state. The likelihood of different transitions between states is determined to determine which transition between states is most likely (e.g., to determine a "survivor" path). The instruction may be used to perform add, compare, and select operations in conjunction with other executable instructions to perform convolutional decoding at an electronic device (e.g., mobile devices). For example, the instruction may determine a sum of metrics used to arrive at an arrival state (S) from a first state (2S) (e.g., an even state) and a difference of metrics used to arrive at the same arrival state (S) from a second state (2S+1) (e.g., an odd state). The instruction may also compare the sum with the difference to determine which computation corresponds to a greater value. The computation that corresponds to the greater value may be selected to predict a preceding state (e.g., predict a survivor path). When the instruction is executed by a processor, the selected computation of metrics may be loaded into a register and used during the next decoding stage. The add operation, the compare operation, and the select operation may be performed in the same execution cycle of the instruction. Further, the instruction may take advantage of instruction level parallelism of very long instruction word (VLIW) architectures. For example, a single VLIW packet may contain multiple such instructions that are executable in parallel.

In a particular embodiment, an apparatus includes a memory storing an instruction that identifies a first register, a second register, and a third register. Upon execution of the instruction by a processor, a vector addition operation is performed by the processor to add first values from the first register to second values from the second register. A vector subtraction operation is also performed upon execution of the instruction to subtract the second value from third values from the third register. A vector compare operation is also performed upon execution of the instruction to compare results of the vector addition operation to results of the vector subtraction operation.

In another particular embodiment, a method includes receiving an instruction that identifies a first register, a second register, and a third register. The method also includes executing the instruction by a processor. Executing the instruction includes adding first values from the first register to second values from the second register to generate first results. Executing the instruction also includes subtracting the second values from third values from the third register to generate second results. Executing the instruction also includes comparing the first results to the second results.

In another particular embodiment, an apparatus includes means for storing an instruction that identifies a first register, a second register, and a third register. The apparatus also includes means for executing the instruction. The means for executing the instruction includes means for adding first values from the first register to second values from the second register to generate first results. The means for executing the instruction further includes means for subtracting the second values from third values from the third register to generate second results. The means for executing further includes means for comparing the first results to the second results.

In another particular embodiment, a non-transitory computer-readable medium includes program code that, when executed by a processor, causes the processor to receive a single instruction that identifies a first register, a second register, and a third register. The program code also causes the processor to execute the single instruction. Executing the single instruction includes adding first values from the first register to second values from the second register to generate first results. Executing the single instruction also includes subtracting the second values from third values from the third register to generate second results. Executing the single instruction further includes comparing the first results to the second results.

One particular advantage provided by at least one of the disclosed embodiments is reduced code size and fewer execution cycles for a decoding stage due to use of a single instruction to perform add, compare, and select functionality. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 5 is a block diagram of a particular embodiment of a wireless device that includes a memory storing an instruction identifying a first register, a second register, and a third register.

V. DETAILED DESCRIPTION

An instruction for performing a decode operation may include first values (e.g. a first set of path metric values of a decoder), second values (e.g., branch metric values), and third values (e.g., a second set of path metric values of the decoder). A decoder may use the first, second, and third values to determine a preceding state during a decoding operation (e.g., determine a survivor path). For example, the first values may correspond to path metrics of an even state (2S) used to arrive at an arrival state (S) and the third values may correspond to path metrics of an odd state (2S+1) used to arrive at the arrival state (S). The second values may correspond to branch metrics that are obtained from demodulated symbols and may be a function of a code polynomial. The instruction may optionally identify a destination register. When the instruction is executed, a first result and a second result may be generated. The first result may be generated in response to a vector addition operation. For example, a processor may add the first values to the second values to generate the first result. The second result may be generated in response to a vector subtraction operation. For example, the processor may subtract the second values from the third values to generate the second result. In a particular embodiment, the first values and the third values may include complementary bits.

A vector compare operation is performed to compare the first results (e.g., the results associated with the even states (2S)) to the second results (e.g., the results associated with the odd states (2S+1)). When the first results are greater than the second results, a preceding state that corresponds to an even state (2S) may be selected. When the second results are greater than the first results, a preceding state that corresponds to an odd state (2S+1) may be selected.

Figure 1:
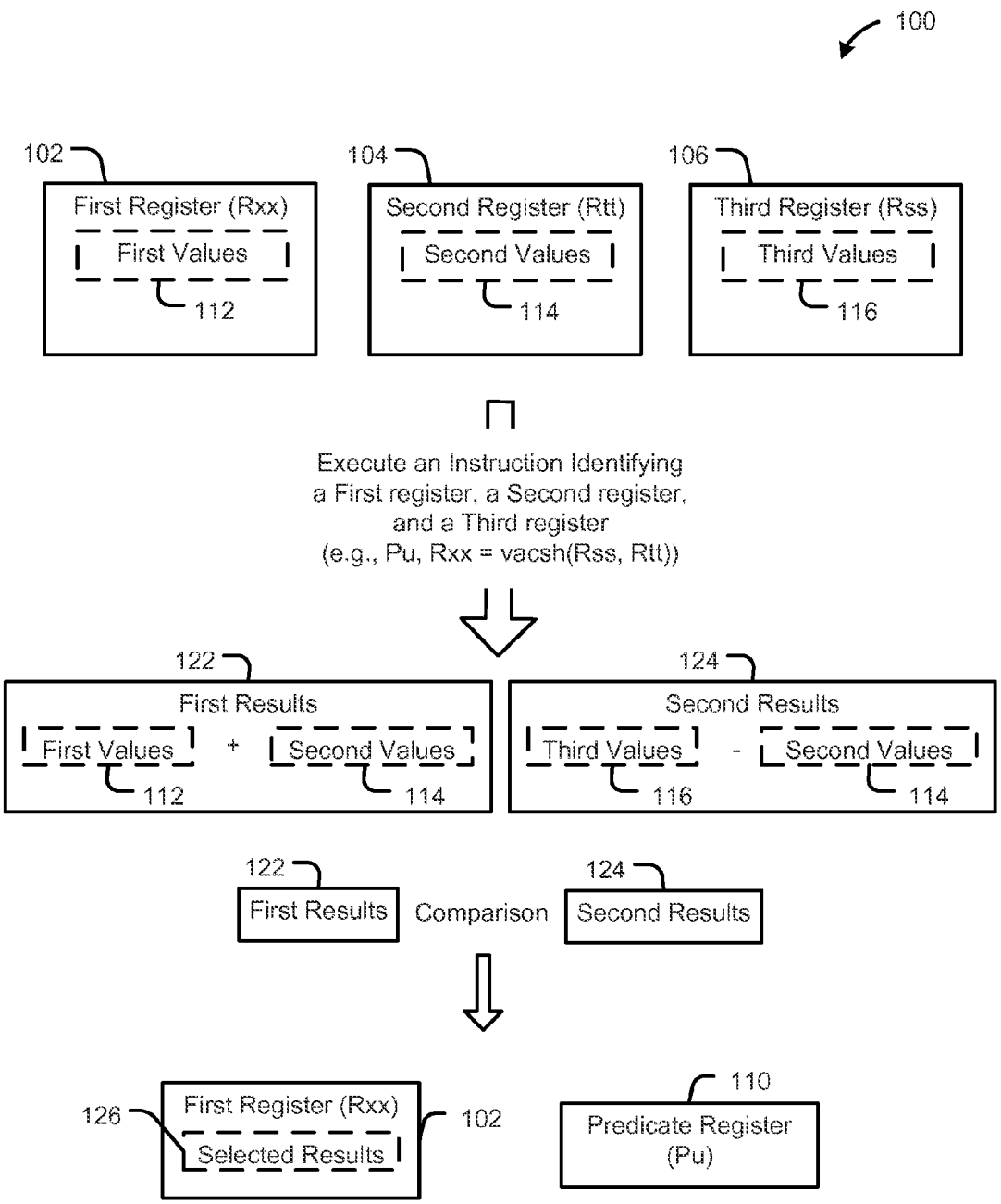
FIG. 1 is a diagram that illustrates executing an instruction that identifies a first register, a second register, and a third register.

Referring to FIG. 1, a first illustrative example of execution of an instruction 100 that identifies a first register, a second register, and a third register is shown. In a particular embodiment, the instruction 100 may identify a first register 102, a second register 104, a third register 106, and a predicate register 110. The first register 102 may store first values 112, the second register 104 may store second values 114, and the third register 106 may store third values 116. The instruction 100 may be "Pu, Rxx=vacsh(Rss, Rtt)," where 'vacsh' is an opcode of the 100 instruction, 'Rxx' is the first register 102, 'Rtt' is the second register 104, 'Rss' is the third register 106, and 'Pu' is the predicate register 110 that predicts a survivor state (i.e., a preceding state) based on whether a recovered transition (e.g., an encoded transition) corresponds to an even state (2S) or an odd state (2S+1).

Results of the vector compare operation may be stored in the predicate register 110 to predict whether a preceding state (e.g. the survivor path) corresponds to an even state (2S) or to an odd state (2S+1). The survivor state may be a function of the metrics used to arrive at an arrival state (S). For example, the first values 112 may correspond to a first set of path metric values used to arrive at the arrival state (S) from an even state (2S). Path metric values may correspond to values associated with a distance over the most likely path to arrive at the arrival state (S). The second values 114 may correspond to branch metric values. The branch metric values may correspond to values measuring a normalized distance between states. The third values 116 may correspond to a second set of path metric values used to arrive at the arrival state (S) from an odd state (2S+1). At the arrival state (S), a decoder, such as a Viterbi decoder, may select between an even preceding state (2S) and an odd preceding state (2S+1) based on the path metric values 112, 116 used to arrive at the arrival state (S).

During operation, a vector adder within a processor may perform a vector addition operation to add the first values 112 from the first register 102 to the second values 114 from the second register 104. For example, the first set of path metric values may be added to the branch metric values to generate first results 122. A vector subtractor within the processor may perform a vector subtraction operation to subtract the second values 114 from the third values 116 of the third register 106. For example, the second set of path metric values may be subtracted from the branch metric values to generate second results 124. A comparator within the processor may perform a vector compare operation to compare the first results 122 to the second results 124 to determine which of the results 122, 124 correspond to a greater value.

The processor may perform a vector select operation to select the results 122 or 124 that correspond to the greater value and the first register 102 may be updated with the selected results 126. For example, when the first results 122 are greater than the second results 124, the first results 122 are stored in the first register 102 as the selected results 126 and the preceding state is predicted to correspond to an even state (2S). When the second results 124 are greater than the first results 122, the second results 124 are stored in the first register 102 as the selected results 126 and the preceding state is predicted to correspond to an odd state (2S+1).

It will be appreciated that the described single instruction 100 may enable the vector addition operation, the vector subtraction operation, the vector compare operation, and the vector select operation to be performed during the same execution cycle. Implementing the vector addition operation, the vector subtraction operation, the vector compare operation, and the vector select operation as one instruction (e.g., the "vacsh" instruction) as opposed to four separate instructions may yield approximately a forty percent gain in processing speed. For example, the single instruction may be executed using three pipeline cycles as compared to five pipeline cycles (for four instructions). It will also be appreciated that the throughput may be approximately equal to two butterflies per cycle when the instruction 100 is issued. For example, each butterfly may correspond to a number of possible transitions from state to state. In a particular embodiment, the throughput may be approximately equal to four butterflies per cycle when the instruction 100 is issued twice during a single cycle.

Figure 2:
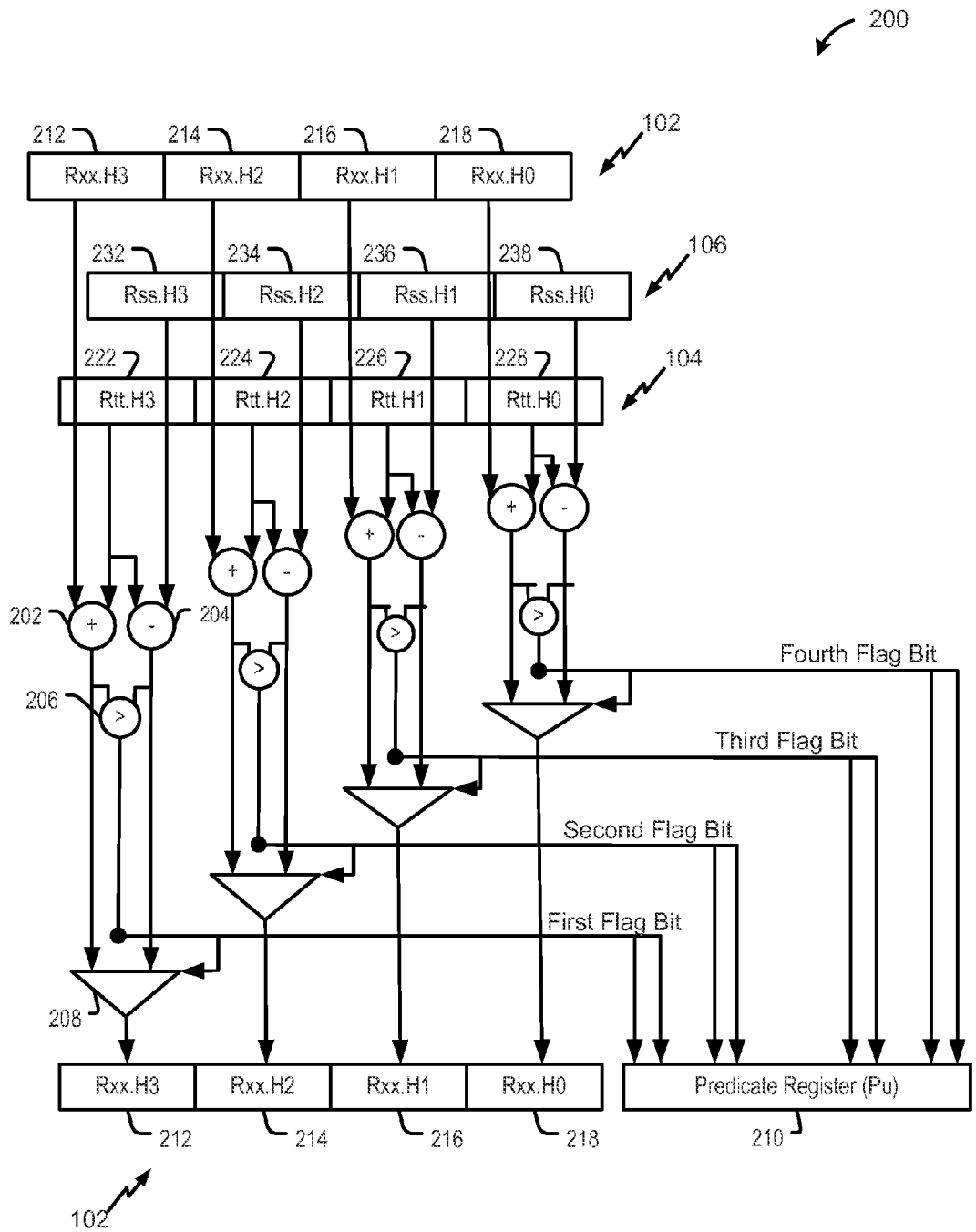
FIG. 2 is another diagram that illustrates executing an instruction that identifies a first register, a second register, and a third register.

Referring to FIG. 2, a second illustrative example of execution of an instruction that identifies the first register, the second register, and the third register is shown and generally designated 200.

In a particular embodiment, the first register 102 may be a 64-bit register that includes four portions. For example, the first register 102 may include a first portion (Rxx.H3) 212, a second portion (Rxx.H2) 214, a third portion (Rxx.H1) 216, and a fourth portion (Rxx.H0) 218. Each portion 212-218 may store a 16-bit value that corresponds to first path metric values. For example, the first portion 212 may store a first 16-bit value ($x_1$), the second portion 214 may store a second 16-bit value ($x_2$), the third portion 216 may store a third 16-bit value ($x_3$), and the fourth portion 218 may store a fourth 16-bit value ($x_4$). The first path metric values may correspond to the first values 112 of FIG. 1. For example, the first path metric values may correspond to the first set of path metric values used to arrive at the arrival state (S) from an even state (2S).

In a particular embodiment, the second register 104 may be a 64-bit register that includes four portions. For example, the second register 104 may include a first portion (Rtt.H3) 222, a second portion (Rtt.H2) 224, a third portion (Rtt.H1) 226, and fourth portion (Rtt.H0) 228. Each portion 222-228 may store a 16-bit value that corresponds to branch metric values. For example, the first portion 222 may store a first 16-bit value ($y_1$), the second portion 224 may store a second 16-bit value ($y_2$), the third portion 226 may store a third 16-bit value ($y_3$), and the fourth portion 228 may store a fourth 16-bit value ($y_4$).

In a particular embodiment, the third register 106 may be a 64-bit register that includes four portions. For example, the third register 106 may include a first portion (Rss.H3) 232, a second portion (Rss.H2) 234, a third portion (Rss.H1) 236, and a fourth portion (Rss.H0) 238. Each portion 232-238 may store a 16-bit value that corresponds to second path metric values. For example, the first portion 232 may store a first 16-bit value ($z_1$), the second portion 234 may store a second 16-bit value ($z_2$), the third portion 236 may store a third 16-bit value ($z_3$), and the fourth portion 238 may store a fourth 16-bit value ($z_4$). The second path metric values may correspond to the third values 116 of FIG. 1. For example, the second path metric values may correspond to the second set of path metric values used to arrive at the arrival state (S) from an even state (2S).

A first vector adder 202 is configured to add the first 16-bit value ($x_1$) from the first portion 212 of the first register 102 to the first 16-bit value ($y_1$) from the first portion 222 of the second register 104 to generate a first 16-bit result. A first vector subtractor 204 is configured to subtract the first 16-bit value ($y_1$) from the first 16-bit value ($z_1$) from the first portion 232 of the third register 106 to generate a second 16-bit result. A first comparator 206 is configured to compare the first 16-bit result to the second 16-bit result. Based on the comparison, the first comparator 206 may generate a first flag bit (e.g., 1-bit signal) identifying whether the first 16-bit result is greater than the second 16-bit result or whether the second 16-bit result is greater than the first 16-bit result. The first flag bit may provided to a first portion of a predicate register (Pu) 210 and is used to predict whether the preceding state is most likely an even state (2S) or an odd state (2S+1).

The first flag bit may also be provided to a selection device 208. In a particular embodiment, the selection device 208 may be a multiplexer. The selection device 208 is configured to select either the first 16-bit result or the second 16-bit result based on the first flag bit and provide the selected result to the first portion 212 of the first register 102. For example, the selection device 208 may provide the first 16-bit result to the first portion 212 of the first register 102 when the first flag bit indicates that the first 16-bit result is greater than the second 16-bit result. Alternatively, the selection device 208 may provide the second 16-bit result to the first portion 212 of the first register 102 when the first flag bit indicates that the second 16-bit result is greater than the first 16-bit result.

Additional vector adders, vector subtractors, and comparators may operate in parallel and in a substantially similar manner as the first vector adder 202, the first vector subtractor 204, and the first comparator 206. For example, the additional vector adders, vector subtractors, and comparators may generate a second flag bit, a third flag bit, and a fourth flag bit based on the 16-bit values in the corresponding portions of the first register 102, the second register 104, and the third register 106. The second, third, and fourth portions 214-218 of the first register 102 may be updated with 16-bit results based on the second, third, and fourth flag bits, respectively. Thus, four states may be processed during a single execution cycle.

Figure 3:
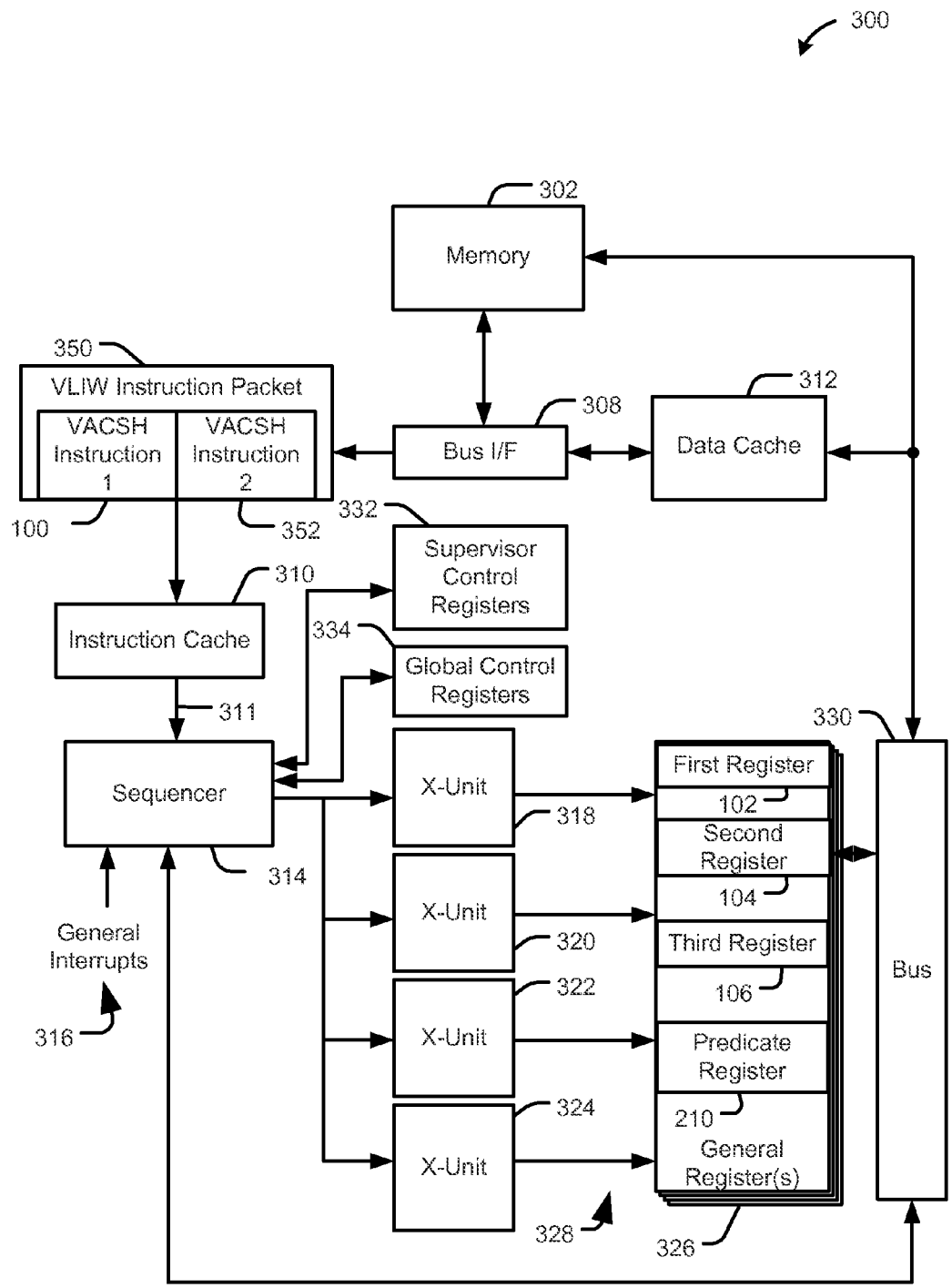
FIG. 3 is a diagram of a particular illustrative embodiment of a system that is operable to store and process an instruction that identifies a first register, a second register, and a third register.

Referring to FIG. 3, a particular illustrative embodiment of a system operable to store and process the instruction 100 (e.g., the 'VACSH' instruction) is disclosed and generally designated 300. The system 300 may include a memory 302 coupled to an instruction cache 310 via a bus interface 308. In a particular embodiment, all or a portion of the system 300 may be integrated into a processor.

The instruction 100 (e.g., the add-compare-select instruction) and a second instruction 352 (e.g., a second add-compare-select instruction) may be included in a very long instruction word (VLIW) packet 350. The instruction 100 may identify the first register 102, the second register 104, and the third register 106, as illustrated in FIGS. 1-2. The first register 102, the second register 104, and the third register 106 may be included in a general register file 326. The first register 102 may store a first set of path metric values used to arrive at the arrival state (S) from an even state (2S), the second register 104 may store branch metric values, and the third register 106 may store a second set of path metric values used to arrive at the arrival state (S) from an odd state (2S+1). The instruction 100 may also identify the predicate register 210. Results of the vector compare operation, as described with respect to FIGS. 1-2, may be stored in the predicate register 210 to predict whether a preceding state (e.g. a survivor path) corresponds to an even state (2S) or to an odd state (2S+1). The predicate register 210 may also be included in the general register file 326.

The memory 302 may transmit the instruction 100 to the instruction cache 310 via the bus interface 308. A data cache 312 may also be coupled to the memory 302 via the bus interface 308. In a particular embodiment, the memory 302 may be accessible by a decoder that uses the instruction 100 to perform a vector addition operation, a vector subtraction operation, vector compare operation, a vector selection operation, or any combination thereof, as described with respect to FIGS. 1-2. For example, the decoder may be part of a coder/decoder (CODEC), as further described with reference to FIG. 5.

The instruction cache 310 may be coupled to a sequencer 314 via a bus 311. The sequencer 314 may receive general interrupts 316, which may be retrieved from an interrupt register (not shown). In a particular embodiment, the instruction cache 310 may be coupled to the sequencer 314 via a plurality of current instruction registers (not shown), which may be coupled to the bus 311 and associated with particular threads (e.g., hardware threads) of the system 300. In a particular embodiment, the processor 300 may be an interleaved multi-threaded processor including six (6) threads. In another particular embodiment, the processor 300 may include three (3) or four (4) threads.

In a particular embodiment, the bus 311 may be a one-hundred and twenty-eight bit (128-bit) bus and the sequencer 314 may be configured to retrieve instructions from the memory 302 via instruction packets (e.g., the very long instruction word (VLIW) instruction packet 350 including the instruction 100 and the second instruction 352). The sequencer 314 may be coupled to a first instruction execution unit 318, a second instruction execution unit 320, a third instruction execution unit 322, and a fourth instruction execution unit 324. It should be noted that there may be fewer or more instruction execution units. Each instruction execution unit 318-324 may be coupled to the general register file 326 via a first bus 328. The general register file 326 may also be coupled to the sequencer 314, the data cache 312, and the memory 302 via a second bus 330.

The system 300 may also include supervisor control registers 332 and global control registers 334 to store bits that may be accessed by control logic within the sequencer 314 to determine whether to accept interrupts (e.g., the general interrupts 316) and to control execution of instructions.

In a particular embodiment, any of the execution units 318-324 may execute the instruction 100 to generate the first results 122 and the second results 124 of FIG. 1. In another embodiment, some, but not all, of the execution units 318-324 may execute the instruction 100. For example, the execution units 318-324 may include an arithmetic logic unit (ALU) that includes the vector adders, vector subtractors, comparators, and selection devices as described with respect to FIG. 2. The execution units 318-324 may generate first results by adding the first set of path metric values stored in the first register 102 to the branch metric values stored in the second register 104 via vector adders, such as the vector adder 202 described with respect to FIG. 2. The execution units 318-324 may generate second results by subtracting the branch metric values stored in the second register 104 from the second set of path metric values stored in the third register 106 via vector subtractors, such as the vector subtractor 204 described with respect to FIG. 2. The execution units 318-324 may compare the first results to the second results to determine which results are greater and provide a signal indicating the results of the comparison to the predicate register 210. Information stored in the predicate register 210 may be used to predict whether a preceding state corresponds to an even state (2S) or to an odd state (2S+1).

Thus, during decoding of an encoded data stream, a preceding state of an encoded data signal may be predicted from path metrics used to recover an arrival state using a single instruction. Further, depending on the comparison, either the first results or the second results may be stored in the first register to be used in a subsequent state predication. The instruction 100 may achieve an overall reduction in code size and perform fewer execution cycles of a processor due to the use of a single instruction to predict a preceding state. It will be appreciated that executing the instruction 100 and the second instruction 352 at the same time may increase efficiency by enabling the system 300 to simultaneously predict multiple preceding states corresponding to multiple Viterbi paths.

It should be noted that the system 300 depicted in FIG. 3 is for example only. The disclosed instruction and techniques may be supported by and executed within other architectures (e.g., micro-architectures and digital signal processor (DSP) architectures). For example, an alternate DSP architecture may include more, fewer, and/or different components than the system 300 of FIG. 3. To illustrate, an alternate DSP architecture may include two execution units and two load/store units instead of four execution units, as illustrated in FIG. 3.

Figure 4:
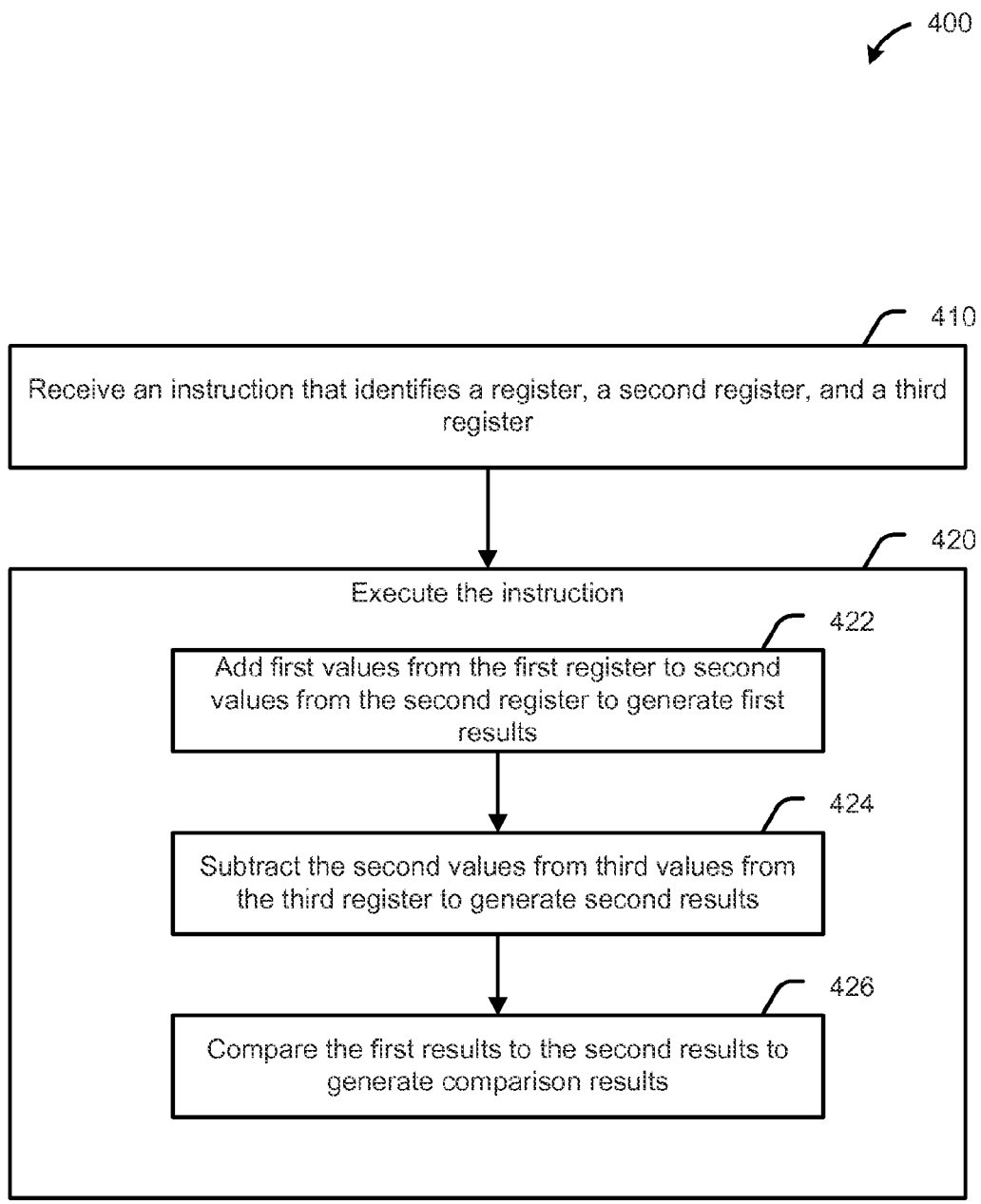
FIG. 4 is a flow chart of a particular illustrative embodiment of a method of processing an instruction that identifies a first register, a second register, and a third register.

Referring to FIG. 4, a flow chart of a particular illustrative embodiment of a method of processing an instruction that identifies a first register, a second register, and a third register is depicted and generally designated 400. In an illustrative embodiment, the method 400 may be performed at the system 300 of FIG. 3 and may be illustrated with reference to FIGS. 1-2.

The method 400 may include receiving an instruction that identifies a first register, a second register, and a third register, at 410. For example, in FIG. 3, the instruction 100 may be received at one of the execution units 318-324. The instruction 100 may identify the first register 102, the second register 104, and the third register 106.

The method 400 may also include executing the instruction, at 420. For example, in FIG. 3, the instruction 100 may be executed by one of the execution units 318-324. Executing 420 the instruction may include adding first values from the first register to second values from the second register to generate first results, at 422. For example, in FIG. 3, a vector adder within an ALU of one of the execution units 318-324 may generate first results by adding the first set of path metric values stored in the first register 102 to the branch metric values stored in the second register 104. Executing 420 the instruction may also include subtracting second values from third values from the third register to generate second results, at 424. For example, in FIG. 3, a vector subtractor within the ALU of one of the execution units 318-324 may generate second results by subtracting the branch metric values stored in the second register 104 from the second set of path metric values stored in the third register 106. Executing 420 the instruction may also include comparing the first results to the second results generate comparison results, at 426. For example, in FIG. 3, a comparator within the ALU of one of the execution units 318-324 may compare the first results to the second results to determine which of the results is greater and provide a signal indicating the greater result to the predicate register 210. Information stored in the predicate register 210 may be used to predict whether a preceding state corresponds to an even state (2S) or to an odd state (2S+1).

The method 400 of FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware, or any combination thereof. As an example, the method 400 of FIG. 4 can be performed by a processor or component thereof that executes program code or instructions, as described with respect to FIGS. 3 and 5.

Referring to FIG. 5, a block diagram of a particular illustrative embodiment of a wireless device that includes a memory 532 storing the instruction 100 (e.g., the add-compare-select instruction) identifying the first register 102, the second register 104, and the third register 106 is depicted and generally designated 500. The device 500 includes a processor 564, such as a digital signal processor (DSP), coupled to the memory 532. An instruction cache (e.g., illustrative instruction cache 310) may also be coupled to the memory 532 and to the processor 564. In a particular embodiment, the memory 532 stores and transmits instructions executable by the processor 564, such as the instruction 100, to the instruction cache 310.

FIG. 5 also shows a display controller 526 that is coupled to the processor 564 and to a display 528. A coder/decoder (CODEC) 534 can also be coupled to the processor 564. A speaker 536 and a microphone 538 can be coupled to the CODEC 534. FIG. 5 also indicates that a wireless controller 540 can be coupled to the processor 564 and to a wireless antenna 542. In a particular embodiment, the processor 564, the display controller 526, the memory 532, the CODEC 534, and the wireless controller 540 are included in a system-in-package or system-on-chip device 522. In a particular embodiment, the memory 532 or the instruction cache 310 including the instruction 100 may be accessible by the CODEC 534 that uses the instruction 100 to perform convolutional decoding during audio or video decoding at an electronic device (e.g., the wireless device 500). In a particular embodiment, the CODEC 534 includes a Viterbi decoder.

When processed, the instruction 100 causes the processor 564 to generate first results by adding the first set of path metric values stored in the first register 102 to the branch metric values stored in the second register 104. The instruction 100 also causes the processor 564 to generate second results by subtracting the branch metric values stored in the second register 104 from the second set of path metric values stored in the third register 106. Upon generating the first and second results, the instruction 100 may cause the processor 564 to compare the first results to the second results to determine which of the results is greater and to provide a signal indicating the greater result to the predicate register 210. Based on the comparison, the first register 102 may be updated with either the first results or the second results. For example, if the first results are greater than the second results, the first results may be stored in the first register 102. Alternatively, if the second results are greater than the first results, the second results may be stored in the first register 102.

In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

It should be noted that although FIG. 5 depicts a wireless communications device, a processor for executing an add-compare-select instruction, such as the processor 564, the memory 532, and the instruction cache 310 storing the add-compare-select instruction may alternately be integrated into a set-top box, a music player, a video player, an entertainment unit, a navigation device, a personal digital assistant (PDA), a fixed location data unit, or a computer.

In conjunction with the described embodiments, an apparatus is disclosed that includes means for storing an instruction that identifies a first register, a second register, and a third register. For example, the means for storing may be the memory 302 of FIG. 3, the memory 532 of FIG. 5, the instruction cache 310 of FIG. 3 and FIG. 5, one or more other devices configured to store an instruction, or any combination thereof.

The apparatus may also include means for executing the instruction. For example, the means for executing the instruction may include the vector adders of FIG. 2, the vector subtractors of FIG. 2, the comparators of FIG. 2, the selection devices of FIG. 2, one or more of the execution units 318, 320, 322, and 324 of FIG. 3, the processor 564 of FIG. 5, one or more other devices configured to execute an instruction, or any combination thereof.

The apparatus may also include means for adding first values from the first register to second values from the second register to generate first results. For example, the means for adding may include the vector adders of FIG. 2, one or more of the execution units 318, 320, 322, and 324 of FIG. 3, the processor 564 of FIG. 5, one or more other devices configured to add values, or any combination thereof.

The apparatus may also include means for subtracting the second values from third values from the third register to generate second results. For example, the means for adding may include the vector subtractors of FIG. 2, one or more of the execution units 318, 320, 322, and 324 of FIG. 3, the processor 564 of FIG. 5, one or more other devices configured to subtract values, or any combination thereof.

The apparatus may also include means for comparing the first results to the second results. For example, the means for comparing may include the comparators of FIG. 2, one or more of the execution units 318, 320, 322, and 324 of FIG. 3, the processor 564 of FIG. 5, one or more other devices configured to compare results, or any combination thereof.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a memory storing an instruction that identifies a first register, a second register, and a third register, wherein upon execution of the instruction by a processor:
      a vector addition operation is performed by the processor to add first values from the first register to second values from the second register;
      a vector subtraction operation is performed to subtract the second values from third values from the third register; and
      a vector compare operation is performed to compare results of the vector addition operation to results of the vector subtraction operation.

2. The apparatus of claim 1, wherein upon execution of the instruction by the processor, a vector selection operation is performed to:
   select the results of the vector addition operation or the results of the vector subtraction operation based on the comparison; and
   update the first register with the selected results.

3. The apparatus of claim 2, wherein the results of the vector addition operation are selected when the results of the vector addition operation are greater than the results of the vector subtraction operation, and wherein the results of the vector subtraction operation are selected when the results of the vector subtraction operation are greater than the results of the vector addition operation.

4. The apparatus of claim 3, wherein a decoder determines to transition to an even preceding state when the selected results are the results of the vector addition operation, and wherein the decoder determines to transition to an odd preceding state when the selected results are the results of the vector subtraction operation.

5. The apparatus of claim 2, wherein the vector addition operation, the vector subtraction operation, the vector compare operation, and the vector selection operation are performed during the same execution cycle.

6. The apparatus of claim 1, wherein the instruction further identifies a memory location, and wherein results of the vector compare operation are stored at the memory location.

7. The apparatus of claim 6, wherein the memory location corresponds to the first register.

8. The apparatus of claim 1, wherein the first values are a first set of path metric values of a decoder, wherein the second values are branch metric values, wherein the third values are a second set of path metric values.

9. The apparatus of claim 8, wherein the decoder is a Viterbi decoder.

10. The apparatus of claim 1, further comprising a very long instruction word (VLIW) packet that includes the instruction and a second instruction.

11. A method comprising:
    receiving an instruction that identifies a first register, a second register, and a third register; and
    executing the instruction by a processor, wherein executing the instruction comprises:
       adding first values from the first register to second values from the second register to generate first results;
       subtracting the second values from third values from the third register to generate second results; and
       comparing the first results to the second results.

12. The method of claim 11, wherein executing the instruction further comprises:
    selecting the first results or the second results based on the comparison; and
    updating the first register with the selected results.

13. The method of claim 12, wherein the first results are selected when the first results are greater than the second results, and wherein the second results are selected when the second results are greater than the first results.

14. The method of claim 13, wherein adding the first values to the second values, subtracting the second values from the third values, comparing the first results to the second results, and selecting the first results or the second results are performed during the same execution cycle.

15. The method of claim 11, wherein the instruction further identifies a memory location, and wherein executing the instruction further comprises storing an outcome of comparing the first results to the second results at the memory location.

16. The method of claim 11, wherein the first values are a first set of path metric values of a decoder, wherein the second values are branch metric values, wherein the third values are a second set of path metric values.

17. The method of claim 16, wherein the decoder is a Viterbi decoder.

18. The method of claim 11, further comprising receiving a very long instruction word (VLIW) packet that includes the instruction and a second instruction.

19. An apparatus comprising:
    means for storing an instruction that identifies a first register, a second register, and a third register; and
    means for executing the instruction, wherein the means for executing the instruction comprises:
       means for adding first values from the first register to second values from the second register to generate first results;
       means for subtracting the second values from third values from the third register to generate second results; and
       means for comparing the first results to the second results.

20. The apparatus of claim 19, wherein the means for adding includes a vector adder, wherein the means for subtracting includes a vector subtractor, and wherein the means for comparing includes a comparator.

21. The apparatus of claim 19, wherein the means for executing the instruction is configured to add the first values to the second values, subtract the second values from the third values, and compare the first results to the second results during the same execution cycle.

22. A non-transitory computer-readable medium including program code that, when executed by a processor, causes the processor to:
  receive a single instruction that identifies a first register, a second register, and a third register; and
  execute the single instruction, wherein executing the single instruction includes:
    adding first values from the first register to second values from the second register to generate first results;
    subtracting the second values from third values from the third register to generate second results; and
    comparing the first results to the second results.

23. The non-transitory computer-readable medium of claim 22, wherein executing the single instruction further includes:
  selecting one of the first results or the second results based on the comparison; and
  updating the first register with the selected results.

24. The non-transitory computer-readable medium of claim 23, wherein adding the first values to the second values, subtracting the second values from the third values, comparing the first results to the second results, and updating the first register are performed during the same execution cycle.

25. The non-transitory computer-readable medium of claim 22, wherein executing the single instruction further comprises storing the comparison results at a memory location.

26. The non-transitory computer-readable medium of claim 22, wherein executing the single instruction enables the processor to process multiple preceding states corresponding to multiple Viterbi paths during a single execution cycle.

* * * * *